United States Patent [19]

Beene et al.

[11] Patent Number: 5,673,478
[45] Date of Patent: Oct. 7, 1997

[54] METHOD OF FORMING AN ELECTRONIC DEVICE HAVING I/O REROUTE

[75] Inventors: Gary L. Beene, Dallas; Robert E. Terrill, Carrollton, both of Tex.

[73] Assignee: Texas Instruments Incorporated, Dallas, Tex.

[21] Appl. No.: 558,402

[22] Filed: Nov. 16, 1995

Related U.S. Application Data

[62] Division of Ser. No. 430,625, Apr. 28, 1995, abandoned.

[51] Int. Cl.⁶ ...................................................... H05K 3/36
[52] U.S. Cl. ............................... 29/830; 264/61; 437/209
[58] Field of Search ........................... 29/830; 264/61; 437/209

[56] References Cited

U.S. PATENT DOCUMENTS

| | | | |
|---|---|---|---|
| 4,641,425 | 2/1987 | Dubuisson et al. | 264/61 X |
| 4,736,276 | 4/1988 | Ushifusa et al. | 264/61 X |
| 5,270,261 | 12/1993 | Bertin et al. | 437/974 X |
| 5,324,687 | 6/1994 | Wojnarowski | 437/974 X |
| 5,347,428 | 9/1994 | Carson et al. | |
| 5,426,566 | 6/1995 | Beilstein, Jr. et al. | |
| 5,466,634 | 11/1995 | Beilstein, Jr. et al. | |
| 5,517,754 | 5/1996 | Beilstein, Jr. et al. | 437/209 X |
| 5,563,086 | 10/1996 | Bertin et al. | 437/209 X |

*Primary Examiner*—Carl J. Arbes
*Attorney, Agent, or Firm*—Christopher L. Maginniss; W. James Brady, III; Richard L. Donaldson

[57] ABSTRACT

A method and an apparatus for I/O reroute include the use of reroute traces (16) and overhangs (20). The reroute traces (16) and overhangs (20) are formed using thick film deposition on dies that have been cut from a wafer.

16 Claims, 4 Drawing Sheets

METHOD OF FORMING AN ELECTRONIC DEVICE HAVING I/O REROUTE

This is a division of application Ser. No. 08/430,625, filed Apr. 28, 1995 now abandoned.

TECHNICAL FIELD OF THE INVENTION

This invention relates generally to electronic devices, and more particularly to a method and an apparatus for input/output ("I/O") reroute.

BACKGROUND OF THE INVENTION

In the field of electronics, an important consideration is the amount of space taken up by electronic components. Typically, it is desirable that the space taken up by the electronic components be as small as possible. With integrated circuits, two of the largest consumers of space are the interconnects and the packaging.

One approach for reducing the size taken up by interconnects and packaging involves stacking integrated circuits together into a three dimensional ("3D") configuration. With such configurations, the integrated circuit I/O connection points are rerouted to the edge of the die, for subsequent interconnection with other electronic devices. Prior art processes for performing such rerouting and interconnection have been relatively expensive.

In a related interconnect problem, connections must sometimes be made from one surface of a substrate to the opposite surface. For example, active components are sometimes formed on opposite surfaces of a substrate, or a ground or power connection may be made from one surface of the substrate to the other. Existing techniques for interconnecting these opposite surfaces have also been expensive.

SUMMARY OF THE INVENTION

Therefore, a need has arisen for a method and an apparatus for I/O reroute which eliminate or reduce disadvantages and problems associated with prior art I/O reroute approaches.

In particular, an electronic device is provided which includes a substrate (which may be an IC or other substrate) having a top surface and a side surface, the top surface and the side surface joined at a first edge, with the top surface including a connection area. A conductive trace is disposed between the connection area and the first edge, with the conductive trace comprising a conductive thick film. A conductive overhang is coupled to the conductive trace and disposed on the side surface. The conductive overhang may be formed integrally with and at the same time as the conductive trace, or may be formed separately.

In a particular embodiment, a plurality of such electronic devices are stacked together, with the conductive overhangs of the devices collectively forming a pad grid interface for interconnection. Furthermore, reroute traces can be formed on the side of the stack, to interconnect various overhangs.

In another embodiment, an electronic device is provided in which a substrate has a top surface, a bottom surface, and a side surface. The top surface and the side surface are joined at a first edge, and the bottom surface and the side surface are joined at a second edge. The top surface includes a top connection area, and the bottom surface includes a bottom connection area. A top conductive trace is disposed between the top connection area and the first edge, and a bottom conductive trace is disposed between the bottom connection area in the second edge. A conductive overhang is coupled to the top and bottom conductive traces and disposed on the side surface.

Also provided is a method of forming an electronic device, which includes providing a substrate having a top surface and a side surface, the top surface and the side surface joined at a first edge, the top surface including a top connection area. A top conductive thick film trace is disposed between the top connection area and the first edge, and a conductive overhang is disposed on the side surface and coupled to the top conductive thick film trace.

An important technical advantage of the present invention is the fact that thick film processes are used to form the traces and overhangs. Therefore, the costs associated with prior art thin film deposition techniques are avoided.

Another important technical advantage of the present invention is the fact that connection can be made directly to the side of a substrate, thus avoiding the cost and complexity associated with attaching interconnect leads.

Another important advantage of the present invention is that it allows for reroute on the side of a stacked structure, thus providing significant additional space for interconnection.

Another important technical advantage of the present invention is that it allows for processing of dies cut from wafers, thus avoiding the need to acquire wafers, which can be difficult and expensive. Furthermore, because wafers are usually sold only in relatively large quantities (often more than needed), and because wafers need not be used with the present invention, no excess ICs need be purchased.

Another important technical advantage of the present invention is that it allows for interconnect from one surface of a substrate to an opposing surface, thus avoiding more expensive and complicated interconnect approaches for such connections, such as drill through interconnect approaches.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention and its advantages are best understood by referring to FIGS. 1-7 of the drawings, like numerals being used for like and corresponding parts of the various drawings.

Figure 1:
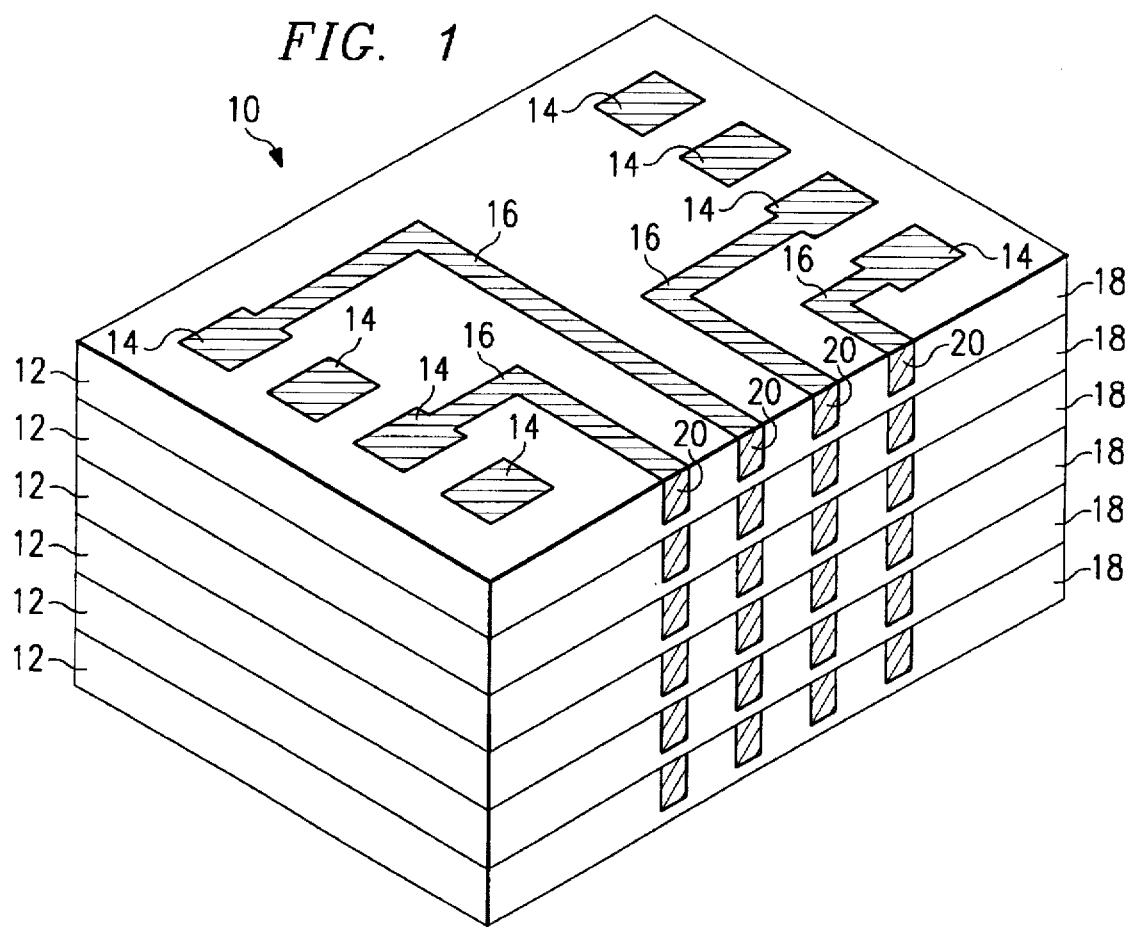
FIG. 1 illustrates a stack of integrated circuits with I/O reroute according to the teachings of the present invention.

FIG. 1 illustrates a stack 10 of integrated circuit dies ("ICs") 12 (also referred to generally as "substrates"). The use of ICs is exemplary only, it being understood any type of substrate or interconnect device may be used with the present invention. The term "substrate" describes any such component. With the particular example of ICs, the ICs 12 may be the same or different types of circuits, and each may be most any type of integrated circuit, such as random access memory, read only memory, electrically erasable programmable read only memory, other programmable read only memory, processor, digital to analog converter, analog to digital converter, or any other conceivable integrated circuit.

Each IC 12 includes input/output ("I/O") pads 14 for coupling other devices to active components on the integrated circuit. These active components are covered by a protective layer, such as a passivation layer, to isolate them from the traces 16, to be discussed.

The I/O pads 14 are rerouted to the edge of the ICs 12 with traces 16. As can be seen in FIG. 1, for each IC 12 these traces 16 extend to the edge of the IC, and are in contact with overhangs 20, which are disposed on a side 18 of the IC 12. The overhangs are designated by reference numeral 20 in FIG. 1. The overhangs may be formed integrally and at the same time with the traces 16, or separately in a second step, as will be discussed.

With the stacked 3D embodiment shown in FIG. 1, each overhang 20 is terminated before the bottom edge of the respective IC 12, thus preventing short circuiting from the overhang 20 of one IC to the next IC. These overhangs 20 form a pad grid array for connection to the next interconnect level, which may be for example a lead frame, a printed wiring board, another 3D structure, or other structure. In a particular embodiment, the next interconnect level includes a matching pad grid array, which may be formed as described above or otherwise, and which is connected to the pad grid array of stack 10. The connection between the pad grid array shown in FIG. 1 and the next interconnect level can be accomplished with solder, a conductive epoxy, Z-axis conductive materials, wire bonds, or any other technique available for conductive attachment. With a solder example, solder is placed on the pad grid array shown in FIG. 1 or on the matching pad grid array in the next interconnect level, the two pad grid arrays are brought into contact, and then the assembly is reflowed to allow the solder to form a more permanent connection.

Figure 2:
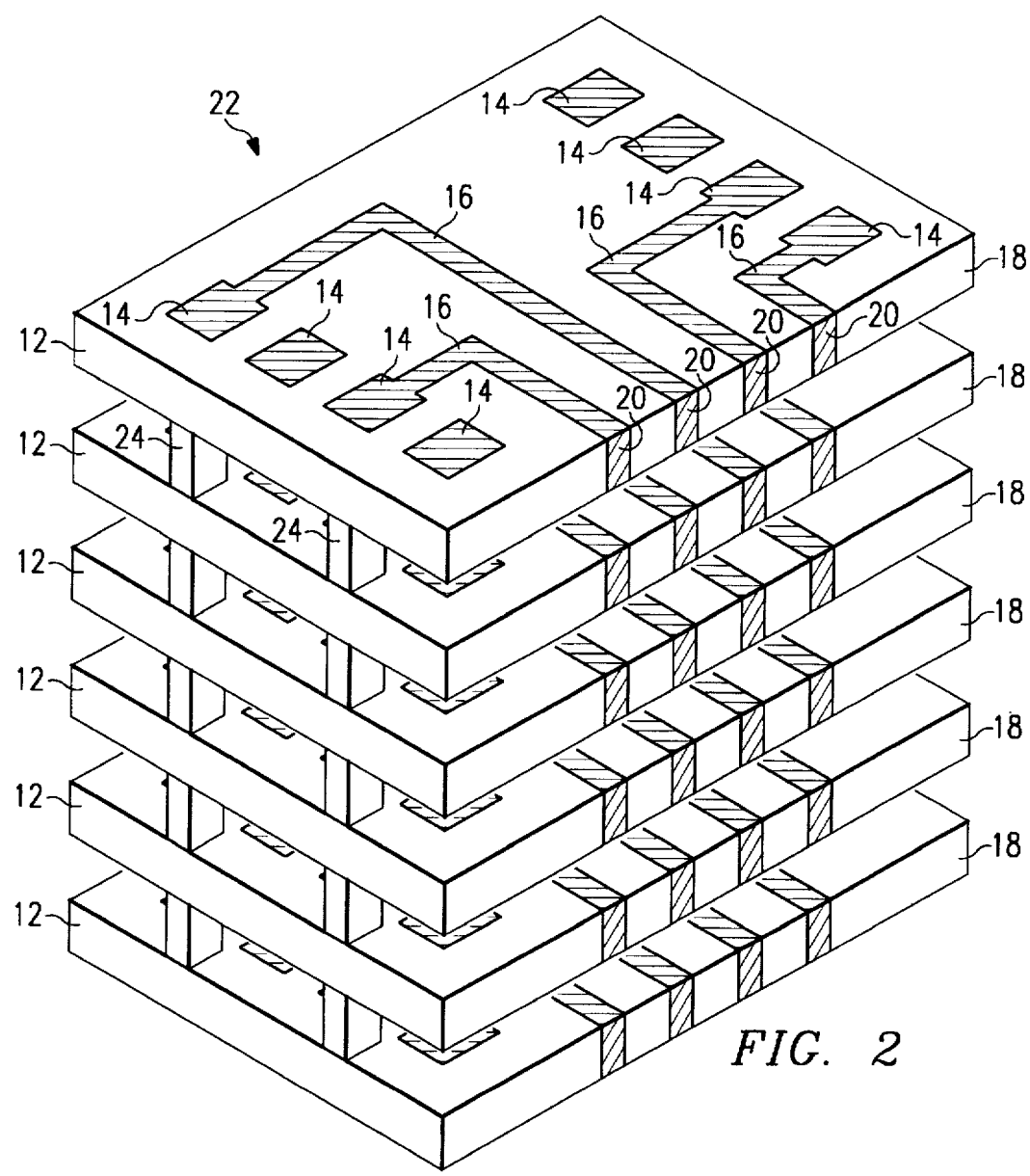
FIG. 2 illustrates a stack of integrated circuits and spacers with I/O reroute according to the teachings of the present invention.

FIG. 2 illustrates another 3D stack 22 in which the ICs 12 are separated by spacers 24. The spacers 24 prevent any short circuiting between each IC 12. As shown in the embodiment of FIG. 2, the overhangs 20 need not be terminated before the bottom of each IC, since the spacers 24 avoid short circuiting from overhang to overhang. However, the overhang 20 of FIG. 2 may be terminated before the bottom edge, as discussed above in connection with FIG. 1.

Overhangs may also be required to terminate at some point if part of the substrate (such as on IC 12) is not electrically isolated from the side surface. With overhangs 20 that terminate before the bottom edge of the IC 12, such as shown in FIG. 1, the overhang may cover approximately half the height of the side 18, although the overhangs can be shorter or longer than this without departing from the intended scope of the present invention. Each IC 12 is a die that has been cut from a wafer, and is approximately 18 mils thick (the height of the side 18 of each integrated circuit 12 is approximately 18 mils). It should be understood that these dimensions are exemplary only, and many other sizes can be used without departing from the intended scope herein.

The reroute traces 16 of the present invention are formed using thick film processes, such as screen printing. Therefore, the costs associated with prior art thin film deposition techniques are avoided. Another technical advantage of the present invention is the fact that connection can be made directly to the side 18, thus avoiding the cost and complexity associated with attaching interconnect leads, such as tape automated bonded ("TAB") leads.

Figure 3:
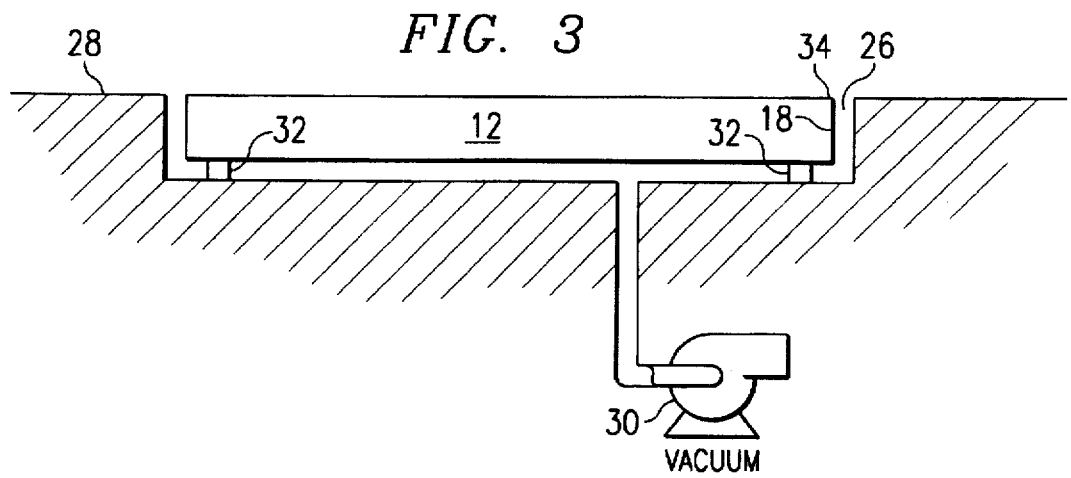
FIG. 3 illustrates an exemplary fixture for forming I/O reroute traces according to the teachings of the present invention.

FIG. 3 illustrates a fixture allowing formation of the reroute traces 16 and overhangs 20 according to the teachings of the present invention. As shown in FIG. 3, an IC is placed within well 26 of fixture 28. Well 26 is coupled to a vacuum 30. Spacers 32 may be provided to prevent IC 12 from plugging the vacuum system. The reroute traces 16 are formed using a thick film deposition process. For example, screen printing may be used to deposit the traces, although other deposition techniques may also be used without departing from the intended scope herein. Whatever process is used should allow for deposition of the conductive material beyond the edge 34 of die 12. For example, with screen printing, the masks used for deposition of the reroute traces 16 and overhangs 20 should allow for deposition to extend beyond the edge of the IC 12 to form the overhangs 20. The vacuum created by vacuum 30 will pull the conductive material down along the edge 18 to form overhangs 20.

Figure 4:
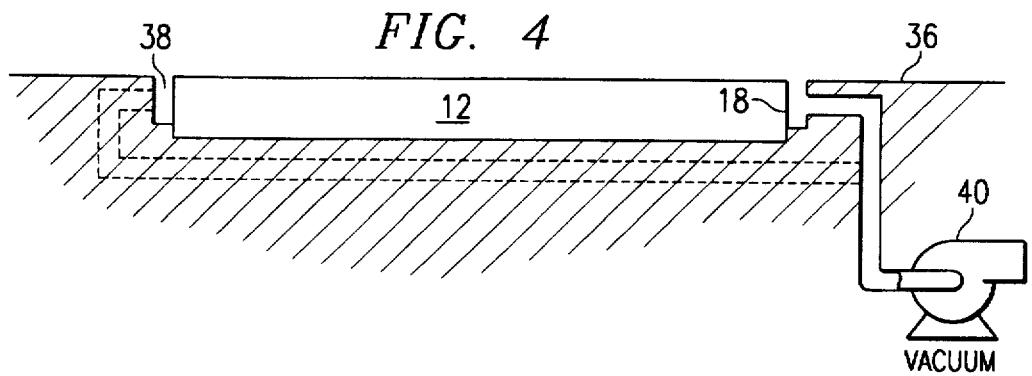
FIG. 4 illustrates another embodiment of a system for forming I/O reroute traces according to the teachings of the present invention.

FIG. 4 illustrates an alternative fixture for creating the overhangs 20 discussed in connection with FIG. 1 which terminate before the bottom edge of the die 12. As shown in FIG. 4, a fixture 36 includes a well 38. Well 38 is stepped so that only a portion of the sides 18 of IC 12 are exposed to a vacuum 40. The conductive material for the reroute traces 16 is then deposited, and the overhang 20 is terminated before the bottom of the die 12 because of the stepped well 38 and the location of vacuum 40.

As shown in FIGS. 3 and 4, overhangs 20 can be formed on more than one side 18. Indeed, all sides may include overhangs.

A material that can be used to form the reroute traces 16 and overhangs 20 is a polymer film paste such as Minico 6300 copper plated thick film ("PTF") made by the Grace Specialty Polymers Company. However, it should be understood that other film pastes with suitable viscosities for forming the overhangs may be used without departing from the intended scope of the present invention. Any suitable conductive paste, such as a thick paste of binding material that includes conductive constituents, can be used.

The fixtures shown in FIGS. 3 and 4 allow for formation of the overhangs 20 in a single step process. However, it should be understood that the reroute traces 16 and the overhangs 20 may be formed in two separate steps, such as by turning the IC 12 to separately deposit the traces and the overhangs, without departing from the intended scope of the present invention.

Figure 5:
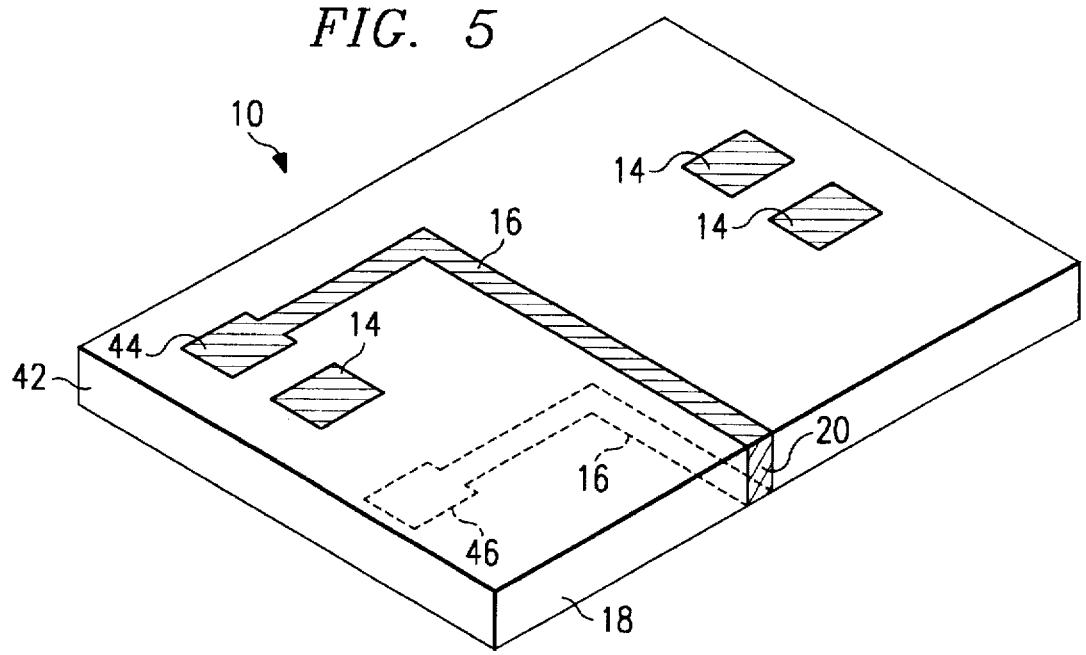
FIG. 5 illustrates an integrated circuit with an interconnection between two opposite surfaces according to the teachings of the present invention.

FIG. 5 illustrates a particular application of the present invention for interconnection between the top and bottom surfaces of an IC or other substrate. In particular, it is sometimes desirable to connect one surface of a substrate 42 to the opposite surface of the substrate 42. Substrate 42 may be an integrated circuit substrate having active components on each side, a flat panel display, a glass substrate, a metal substrate, an inorganic substrate or any other type of substrate. Similarly, any such substrate may be used in place of the ICs 12 shown in the various Figures.

As shown in FIG. 5, a connection point 44 on one surface of the substrate 42 is coupled to a connection point 46 on the opposite surface of the substrate 42. The connection is accomplished by forming reroute traces 16 and overhang 20. In particular, a reroute trace 16 is connected from connection point 44 to a top edge of the substrate 42, and another reroute trace 16 runs from the connection point 46 to a bottom edge of the substrate 42. Overhang 20 electrically couples the two reroute traces 16. Elements such as substrate 42 can also be stacked into 3D structures, as described above. An important technical advantage of this approach is that more expensive and complicated interconnect approaches, such as drill through interconnect approaches, are avoided. Furthermore, by using the low cost thick film deposition approach discussed above, the reroute traces 16 and overhang 20 can be formed quickly and inexpensively.

For complex reroute layouts in any of the embodiments discussed herein, multi-level reroute traces can be formed by passivating successive layers of reroute traces. Furthermore, before forming the overhangs 20, the sides 18 should be passivated to avoid short circuiting from the overhangs 20 to any active components or other overhangs 20 on the same substrate. This passivation can be accomplished in many ways, for example with screen printing, dipping, spraying, or oxidizing, among others.

Figure 6:
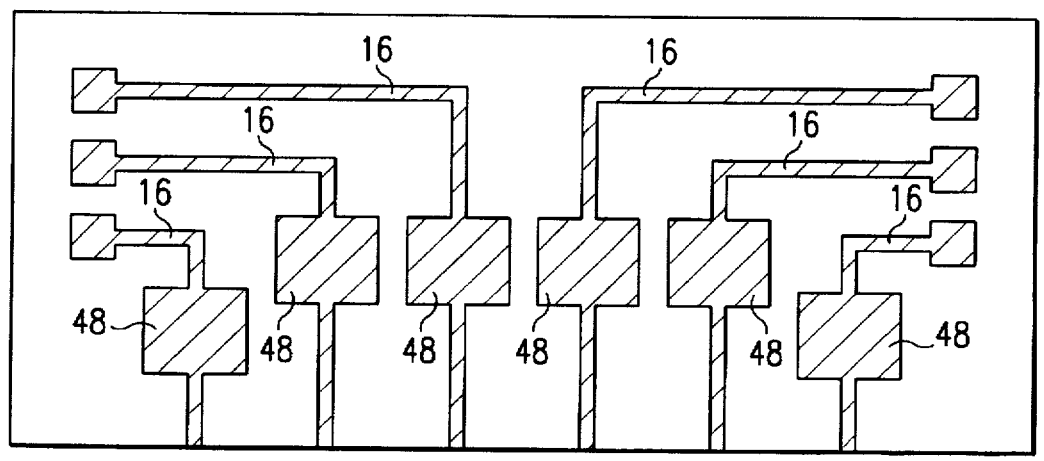
FIG. 6 illustrates I/O reroute with test pads according to teachings of the present invention.

FIG. 6 illustrates a particular embodiment of the present invention in which relatively wide test pads are formed as part of the reroute traces 16. These relatively wide test pads 48 allow for probing with conventional test probes. In a exemplary embodiment, the test pads may be on the order of 20 mils wide, while the reroute traces 16 may be 5 to 6 mils wide, although many other sizes may be used. The test pad array may also be used as a pad grid array, for connection to the next level interconnect.

Figure 7:
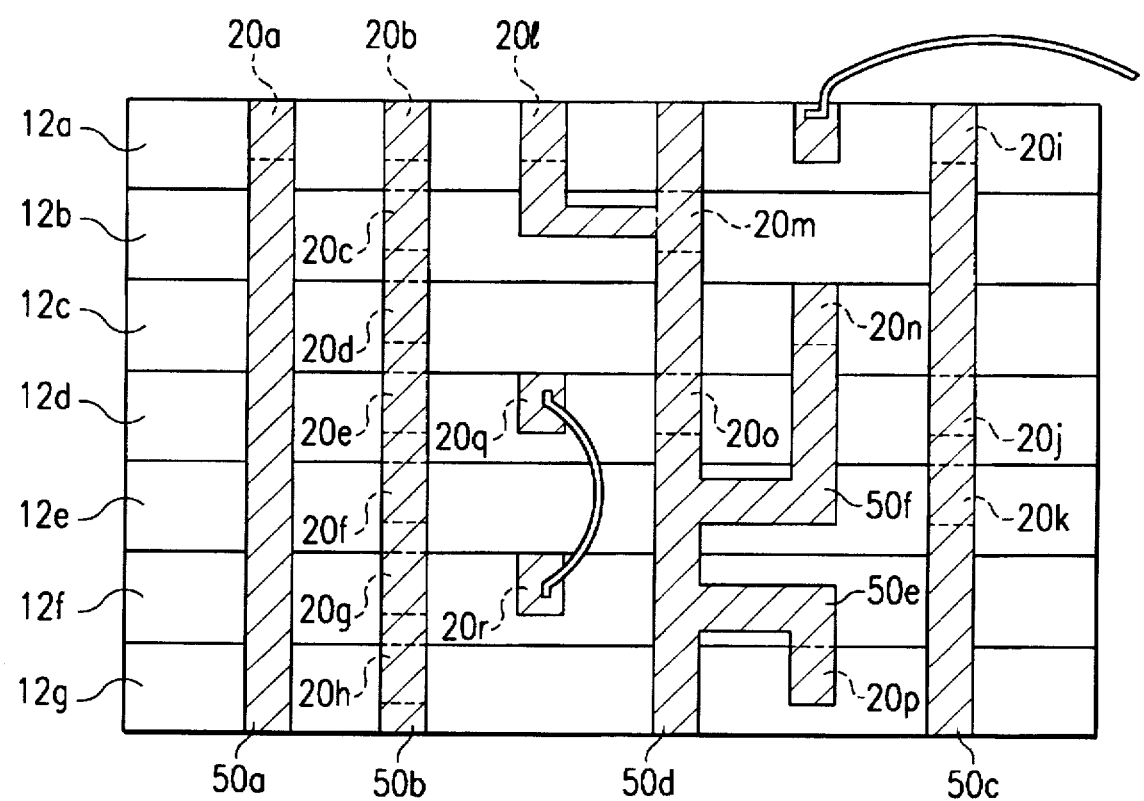
FIG. 7 illustrates an embodiment of 3D-structure reroute according to the teachings of the present invention.

FIG. 7 illustrates an embodiment of reroute on the side of a stacked structure according to the teachings of the present invention. As shown in FIG. 7, several ICs 12a–12g have been stacked together. Reroute traces such as the reroute traces 16 discussed above, are formed on the stacked structure itself, and thus directly on the sides of the ICs 12a–12g. By using reroute traces on the side or sides of the 3D structure, significant advantages result. In particular, by making various connections on the side of the 3D structure (as will be discussed) the need for complicated external interconnection is reduced significantly. Furthermore, using the side or sides of the 3D structure provides significant additional space for rerouting. Because of this additional space, a single layer reroute is typically possible, which allows the use of the thick film paste, which, as described above, significantly reduces costs and complexity.

The rerouting pattern that will be performed along the side of the 3D structure will depend on the particular needs of the application. FIG. 7 illustrates particular approaches for reroute along the side of the 3D structure. It should be understood, however, that other reroute patterns may be used. It should also be understood that reroute may be performed along all of the sides of the 3D structure, with only one side being illustrated for clarity.

As shown in FIG. 7, IC 12a includes an overhang 20a in a particular position. A reroute trace 50a can be deposited as shown in FIG. 7 to connect to overhang 20a. In a particular example, the connection to overhang 20a is unique, and thus no other overhangs are connected to the reroute trace 50a. Reroute trace 50a can then be connected to the next level of interconnect in any appropriate manner. In another example, reroute trace 50b is used to connect overhangs 20b–20h. Each of these overhangs therefore has a common connection. Similarly, reroute trace 50c is used to commonly connect overhangs 20i, 20j, and 20k.

In another example, overhangs that are not in common columns may still be commonly connected through reroute traces such as reroute traces 50d. These reroute traces 50d commonly connect overhangs 20l–20p.

In still another example, certain overhangs, such as overhangs 20q and 20r, may be connected through a wire bond, rather than reroute traces. Similarly, any of the reroute traces or overhangs may also be connected through a wire bond to the next level of interconnect, such as a package or other device.

With the reroute techniques discussed above in connection with FIG. 7, particular elements that make up the stack, such as elements 12a–12g, may have the same or different individual reroute patterns, depending on how the interconnection on the side of the stacked structure is to be implemented.

Although the present invention has been described in detail, it should be understood that various changes, modifications, substitutions, or alterations can be made without departing from the intended scope as defined by the appended claims.

What is claimed is:

1. A method of forming an electronic device, comprising:
   providing a substrate having a top surface and a side surface, the top surface and the side surface joined at a first edge, the top surface including a top connection area;
   disposing a top conductive thick film trace between the top connection area and the first edge; and
   disposing a conductive overhang on the side surface and coupled to the top conductive thick film trace, the step of disposing a conductive overhang including applying a vacuum below the top surface to assist in disposing the conductive overhang on the side surface.

2. The method of claim 1, wherein the substrate includes a bottom surface opposite the top surface, the bottom surface and the side surface joined at a second edge, and wherein disposing the conductive overhang includes coupling the overhang to the second edge.

3. The method of claim 2, wherein the bottom surface includes a bottom connection area, and further comprising forming a bottom conductive thick film trace between the bottom connection area and the second edge.

4. The method of claim 1, wherein the substrate includes a bottom surface opposite the top surface, the bottom surface and the side surface joined at a second edge, and wherein disposing the conductive overhang includes electrically isolating the overhang from the second edge.

5. The method of claim 1, wherein disposing the top conductive thick film trace comprises depositing a paste of binding material including conductive constituents.

6. The method of claim 1, wherein disposing the conductive thick film and disposing the conductive overhang are performed in a single process.

7. A method of forming an electronic device comprising the steps of:
   providing a plurality of substrates, each of said plurality of substrates including a top surface, a bottom surface, and a side surface, said top surface and said side surface joined at a first edge, said bottom surface and said side surface joined at a second edge, said top surface including a top connection area;
   disposing top conductive traces between said top connection areas and said first edges of said substrates;
   coupling conductive overhangs to said top conductive traces and disposing said conductive overhangs on said side surfaces of said substrates by applying vacuum below said top surfaces to assist in disposing said conductive overhangs on said side surfaces;

forming said plurality of substrates into a stack wherein the top surface of one of said substrates is adjacent the bottom surface of another of said substrates; and interconnecting a conductive overhang on one of said substrates with a conductive overhang on another of said substrates.

8. The method in accordance with claim 7 wherein the step of disposing said conductive overhangs includes electrically isolating said conductive overhangs from said second edges.

9. The method in accordance with claim 7 wherein the step of disposing top conductive traces comprises depositing thick film traces including a paste of binding material having conductive constituents.

10. The method in accordance with claim 7 wherein the steps of disposing said top conductive traces and disposing said conductive overhangs on said side surfaces are performed in a single process.

11. The method in accordance with claim 7 wherein the step of providing a plurality of substrates includes providing at least one substrate having a bottom connection area on said bottom surface; and further including the step of disposing a bottom conductive trace between said bottom connection area and said second edge on said at least one substrate; and wherein the coupling step includes coupling a conductive overhang between a top conductive trace and said bottom conductive trace of said at least one substrate and disposing said conductive overhang on said side surface of said at least one substrate.

12. The method in accordance with claim 11 wherein the steps of disposing said top conductive traces and said bottom conductive trace comprise depositing thick film traces including a paste of binding material having conductive constituents.

13. The method in accordance with claim 7 wherein the step of forming said plurality of substrates into a stack includes positioning spacers between at least one pair of adjacent substrates.

14. The method in accordance with claim 7 wherein the step of interconnecting a conductive overhang on one of said substrates with a conductive overhang on another of said substrates comprises depositing a thick film conductive trace on side surfaces of said substrates.

15. The method in accordance with claim 7 wherein the step of interconnecting a conductive overhang on one of said substrates with a conductive overhang on another of said substrates comprises applying a wire bond between said two conductive overhangs.

16. The method in accordance with claim 7 further including a step, performed prior to the step of disposing said conductive overhangs, of applying a passivation layer on said side surfaces of said substrates.

* * * * *